United States Patent [19]

Griswold

[11] 3,793,594

[45] Feb. 19, 1974

[54] WIDE BAND PHASE-COHERENT SELF-CALIBRATING TRANSLATION LOOP

[75] Inventor: Fred Bethel Griswold, Roosevelt, N.J.

[73] Assignee: RCA Corporation, New York, N.Y.

[22] Filed: Feb. 18, 1972

[21] Appl. No.: 227,389

[52] U.S. Cl. .......................... 331/4, 331/14, 331/18, 331/25

[51] Int. Cl. .......................... H03b 3/04

[58] Field of Search .......................... 331/4, 14, 18, 25

[56] References Cited

UNITED STATES PATENTS

| | | | |
|---|---|---|---|
| 3,414,842 | 12/1968 | Broadhead, Jr. | 331/18 X |
| 3,205,451 | 9/1965 | Babany et al. | 331/4 |
| 3,611,175 | 10/1971 | Boelke | 331/4 |

*Primary Examiner*—Roy Lake
*Assistant Examiner*—Siegfried H. Grimm
*Attorney, Agent, or Firm*—Edward J. Norton; Joseph D. Lazar

[57] ABSTRACT

A translation loop with a voltage controlled oscillator (VCO) for generating a plurality of discrete frequencies that are unambiguously selected above or below a reference frequency by calibrating the VCO to the reference frequency without the presence of an offset frequency, a timed gate control subsequently gating the offset frequency for mixing in the loop. A phase detected error in the mixed signals controls the VCO to alter its frequency from the reference frequency to the frequency corresponding to the sum or difference frequency by a control sweep voltage positive or negative going to correspondingly increase or lower the VCO frequency.

8 Claims, 6 Drawing Figures

WIDE BAND PHASE-COHERENT SELF-CALIBRATING TRANSLATION LOOP

The invention herein described was made in the course of or under a contract or subcontract thereunder with the Department of the Navy.

BACKGROUND OF THE INVENTION

1. Field of the Invention

This invention relates to translation loops and more particularly, to translation loops that generate a highly accurate synchronized side band or offset frequency within a wide range of frequencies.

2. Description of the Prior Art

Translation loops, also known as single side band mixers, are known for mixing two signals of different frequencies and for deriving from the combined signals one or more signals representing the sum and differences of the originally mixed signals. Phase locked loops have been used with varying degrees of accuracy to achieve a high order of rejection of undesired signals and to obtain thereby a single frequency signal. In such loops, a voltage controlled oscillator, usually provided with a crystal as a reference source of fixed frequency, is used to control the loop to a selected substantially fixed frequency. Frequency multipliers are used to convert the fixed VCXO frequency to a selected higher frequency. For a loop capable of generating a wide range of frequencies only a crystal controlled voltage controlled oscillator is satisfactory even though costly. A detailed description of such prior art translation loops is included in a following section herein.

SUMMARY OF THE INVENTION

According to the present invention a translation loop is provided with a mixer, phase detector and a voltage controlled oscillator (VCO). A reference frequency signal is mixed with an offset frequency signal from a source that is periodically gated so that the voltage controlled oscillator first generates a signal at the reference frequency and subsequently at the sum or difference frequency of the reference and offset frequency. A programmed control voltage for the voltage controlled oscillator determines whether the offset frequency is a sum or difference product. Frequency deviations of up to about ten percent of the center frequency of the voltage controlled oscillator are achieved without a cycle skip or phase shift of the phase-locked signal.

PRIOR ART

A conventional translation loop of typical design, functions to translate a reference frequency by an offset frequency and reject the reference frequency (carrier) and an unwanted image (undesired side band) frequency. When the offset frequency is a small percentage of the reference frequency, a complex and usually expensive voltage controlled crystal oscillator (VCXO) is required to produce the translated output frequency and, at the same time, not lock on to the undesired side band frequency. If a plurality of frequencies are needed, each being of a different value and all within a wide frequency spectrum one of more multipliers must be utilized following the VCXO in order to produce such wide deviation frequency systems.

Figures 1, 2:
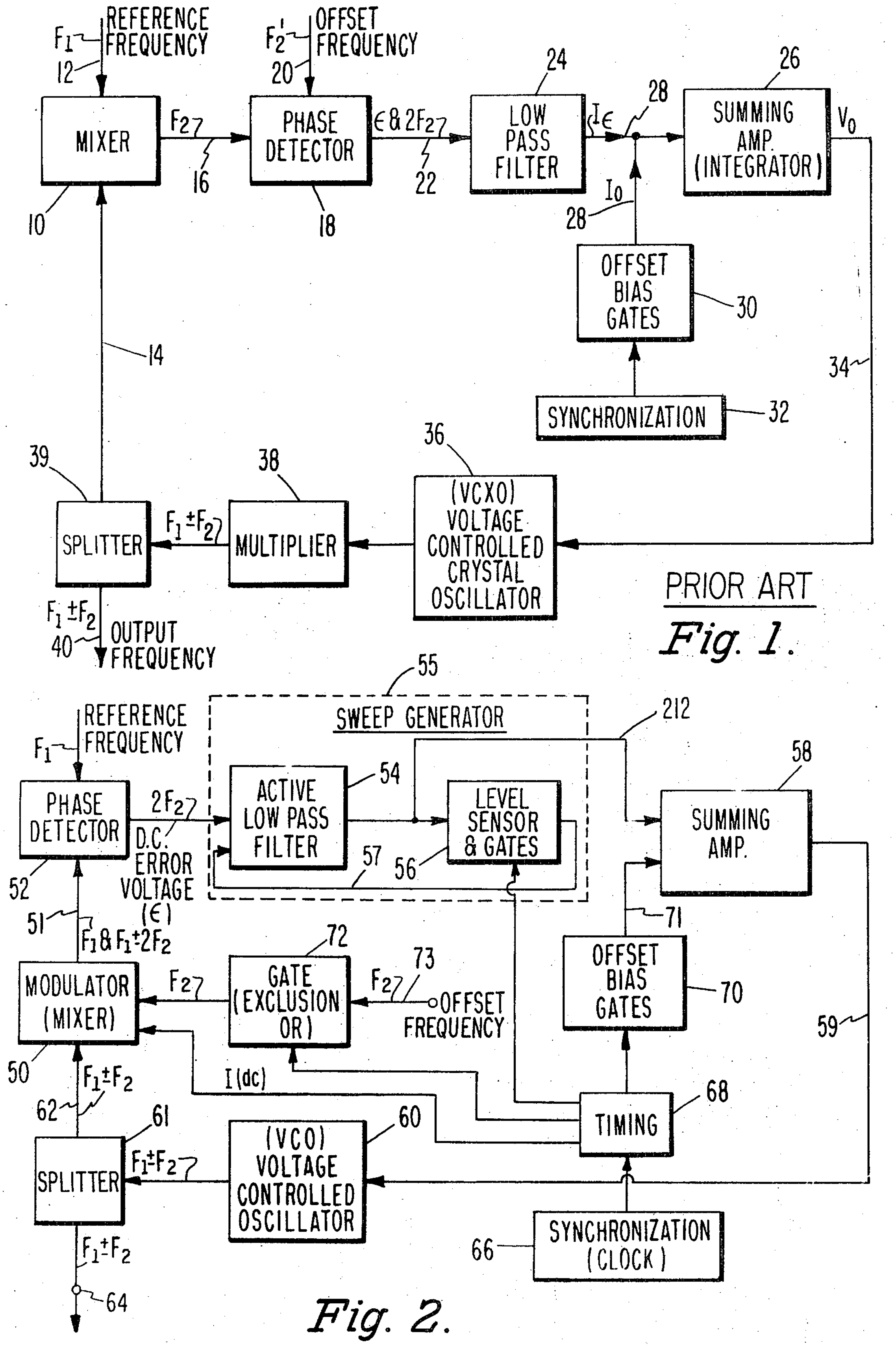
FIG. 1 is a block diagram schematic of a translation loop of conventional form.
FIG. 2 is a block diagram schematic of a translation loop embodying the present invention.

A typical translation loop of conventional design is illustrated in FIG. 1. Such a loop is formed of a mixer 10 having an input 12 of frequency F1 and an input 14 of frequency F1 ± F2. One product of the mixer, frequency F2 is applied to a phase detector 18 over conductor 16. The phase detector 18 compares F2 with a reference frequency F'2 received over conductor 20. The output of the phase detector 18 over conductor 22 is $\epsilon$, a DC error voltage proportional to the phase difference between F2 and F'2 and the frequency 2F2 which is applied to a low pass filter 24, where 2F2 is filtered out and fluctuations in $\epsilon$ are integrated. The integrated error voltage produces a current $I_\epsilon$ conducted to summing amplifier 26 over conductor 28. In addition, another current $I_0$ is applied to summing amplifier 26 over conductor 28 from offset bias gates 30. The magnitude of current $I_0$ is programmed from the offset bias gates from synchronization inputs 32.

The output voltage $V_0$ of summing amplifier 26 is proportional to the sum of input currents $I_\epsilon$ and $I_0$. The summed output voltage $V_0$ is applied to a VCXO 36 over conductor 34 and controls the VCXO operating frequency and phase. The offset bias gates 30 are programmed by synchronization inputs 32 to control the frequency of operation of VCXO 36. Differences between VCXO and the input signal frequencies are detected by phase detector 18 which develops the DC error voltage to modify the frequency and phase of VCXO 36 in accordance with the phase and frequency of inputs F2 and F'2. In order to obtain a wide range of different signal frequencies outputs from such a translation loop, the output frequency of VCXO 36 must be multiplied by frequency multiplier 38 and applied to mixer 10 over conductor 14 via splitter 39.

In such conventional loops, mixer 10 subtracts reference frequency F1 from translated output frequency F1 and F2 to produce difference frequency F2 as one input to phase detector 18 the other input of which being offset frequency F'2. Any differences in phase and frequency of F2 and F'2 will cause VCXO 36 to change its phase and frequency so as to reduce this difference to zero. The closed loop system shown in FIG. 1 provides a translated output frequency that is coherent with the reference frequency input and offset frequency input. The components of this loop and the operation thereof are well known in the art.

A problem in such conventional translation loops is in achieving a lock of the oscillator to the selected offset or side band frequency without locking to spurious signals. The smaller the offset frequency, the more difficult it is to assure unambiguous side band lock-on due to oscillator center frequency uncertainty which may be due to temperature drifting, for example. This can be alleviated by utilizing a voltage controlled crystal oscillator (VCXO) which can be programmed to the correct side band since its voltage-to-frequency transfer function is much more stable than that of a voltage contolled oscillator (VCO). Programming of the offset frequency is accomplished as known in the art by programming biasing offset currents into a summing amplifier used to drive the VCXO.

A VCXO has excellent center frequency stability but is severely limited in frequency deviation capability usually about 0.01 percent of its center frequency. If both small and large frequency offsets are required from such conventional translation loops, then a high order of frequency multiplication must follow the VCXO. Thus, a costly VCXO and multiplier chain are required to achieve both small and large frequency offsets. In addition the multiplier chain will generate spurious side bands at the VCXO frequency. Another approach is to place a VCO in an oven temperature to stabilize its transfer function. Such temperature control is costly, bulky and power consuming. Nevertheless, the crystal oscillator is still limited in its ability to generate oscillations over a wide frequency spectrum. In certain operations, carrier frequencies in the MHz and GHz range require the need for generating single side band frequencies from such carriers in the range of 100 Hertz to 10 megacycles.

DETAILED DESCRIPTION OF A PREFERRED EMBODIMENT

The translation loop illustrated in FIG. 2 embodying the present invention, illustrates a translation loop or single side band mixer, which can generate sequentially one or more discrete side band signals within a wide spectrum of frequencies in precise synchronization relative to a reference carrier. The loop comprises a double side band suppressed carrier mixer 50, a phase detector 52, an active low pass filter 54 controlling a level sensor 56 and driving a summing amplifier 58, the voltage output of which controls the frequency of a voltage controlled oscillator (VCO) 60.

The voltage controlled oscillator is typically a Colpitts oscillator with back-to-back varacaps (diodes having variable capacitance properties) across the tank circuit for frequency control. Placing the diodes back-to-back reduces distortion and increases modulation frequency response. The voltage from the summing amplifier is applied to the varacaps to change their capacity and the frequency of oscillation of the tank circuit.

The signal output of VCO 60 is coupled back via splitter 61 to the mixer 50 as one input thereof over conductor 62. The VCO output is used as an output frequency source for use as desired at terminal 64. Timing signals for controlling the operation of the loop are developed from a clock synchronization source 66 for pulsing a suitable timing circuit 68 for programming offset bias gates 70 and exclusive OR gate 72. Clock 66 and timing circuit 68 are arranged to determine when the translation loop will function to sweep and when it will be locked to an acquired frequency as will be explained. Offset bias gates 70 are suitably arranged to provide predetermined offset currents over path 71 for stepping the output voltage of summing amplifier 58 by predetermined increments to slew the frequency of VCO 60 by amounts corresponding to the frequency of offset frequency $F_2$, applied to the loop over path 73. Clock 66 and timing circuit 68 are arranged to control the amount and sequence of these offset currents as required for the number of different frequencies $F_2$ and also to thus do so in synchronism with the changes of $F_2$. Rather than mix the reference frequency F1 with the translated output or side band frequency as is done in conventional translation loops, the translated output F1 ± F2 according to the invention is mixed with the offset or side band frequency F2 and then is phase detected with the reference frequency F1. This arrangement increases the isolation of the side band or offset frequency F2 from frequency F1 or other spurious signals because the carrier frequency F1 is suppressed by the mixer included in the modulator mixer 50 to be described. The offset frequency or side band frequency $F_2$ may be varied by a suitable variable output frequency synthesizer controlled to generate different frequencies according to a clocked program as embodied, for example, in FIG. 3, to be described.

In order to accommodate large drifts of the VCO 60, a time period is provided for the acquisition of the oscillator to the frequency determined by the output of the summing amplifier 58. During the acquisition period a DC current I from timing circuit 68 in lieu of an offset signal F2 is applied to the modulator mixer 50, gate 72 disconnecting the offset frequency F2 during this period. Timing circuit 68 controls the acquisition period in response to clock 66 to provide the DC current I to modulate 50 and also to activate the sweep generator 55. The mixer thus operates as if it were a straight-through path (62 and 51) such that the VCO output frequency is applied directly to phase detector 52. At the same time, under control of timing circuit 68, a sweep voltage output from the sweep generator 55 is generated so that the loop acquires and phases into the reference frequency (F1). The sweep voltage results from integrating the output of level sensor 56 by the active filter 54, in a manner to be described with respect to FIG. 4. The loop now generates the reference frequency (F1) at the output with no offset. The unambiguous acquisition of the offset or side band frequency is possible in this mode because of the absence of the offset frequency and its image.

F2 is then applied over path 73 through gate 72 to the modulator 50 and the sweep voltage output of sweep generator 55 ramps up towards the proper polarity such that the desired side band frequency is acquired by the VCO. The sweep generator 55 develops an output which is a triangular wave or sawtooth with fast retract such that it can only acquire and translate in one direction only from the reference frequency. Thus, it sweeps from center frequency to the desired side band frequency. The different side band or offset frequencies are determined by programming the offset biases as bias voltages for the summing amplifier 58 in accordance with the modulation sensitivity of the VCO 60, the sensitivity stability being an order of magnitude more stable than the center frequency stability. The offset biases are programmed at the same time the offset frequencies change in accordance with the external control signals from clock 66. In order to prevent the translation loop from skipping or missing cycles and thereby lose phase memory, the loop is made sufficiently wide band such that the offset bias from gates 70 drives summing amplifier 58 and VCO 60 to less than the pull-out range, the pull-out range being the step-in frequency that can be applied to a locked without causing the phase detector to skip cycles. For a damping of 0.7, the pull-out range is roughly three times the natural frequency.

Thus, the translation loop according to this invention utilizes a conventional voltage controlled oscillator (VCO) for generating a plurality of discrete frequencies that are unambiguously selected to be above or below a reference frequency by calibrating the VCO to the reference frequency without the presence of an offset frequency by the timed gate control, and subsequently applying the offset frequency to the loop at the mixer, now gated to accept it. The phase detected errors in the mixed signals control the VCO to alter its frequency from the reference frequency to the frequency corresponding either to the sum or difference frequencies by a control sweep voltage positive or negative going to correspondingly increase or lower the VCO frequency. The use of the splitter and mixer between the VCO and phase detector assures improved rejection of the carrier or reference frequency from the signal output of the loop. In addition, the cross connection of the sweep circuit with the low pass filter provides a positive means to drive unambiguously the VCO from its calibrated reference frequency to the desired side band frequency.

Figure 3:
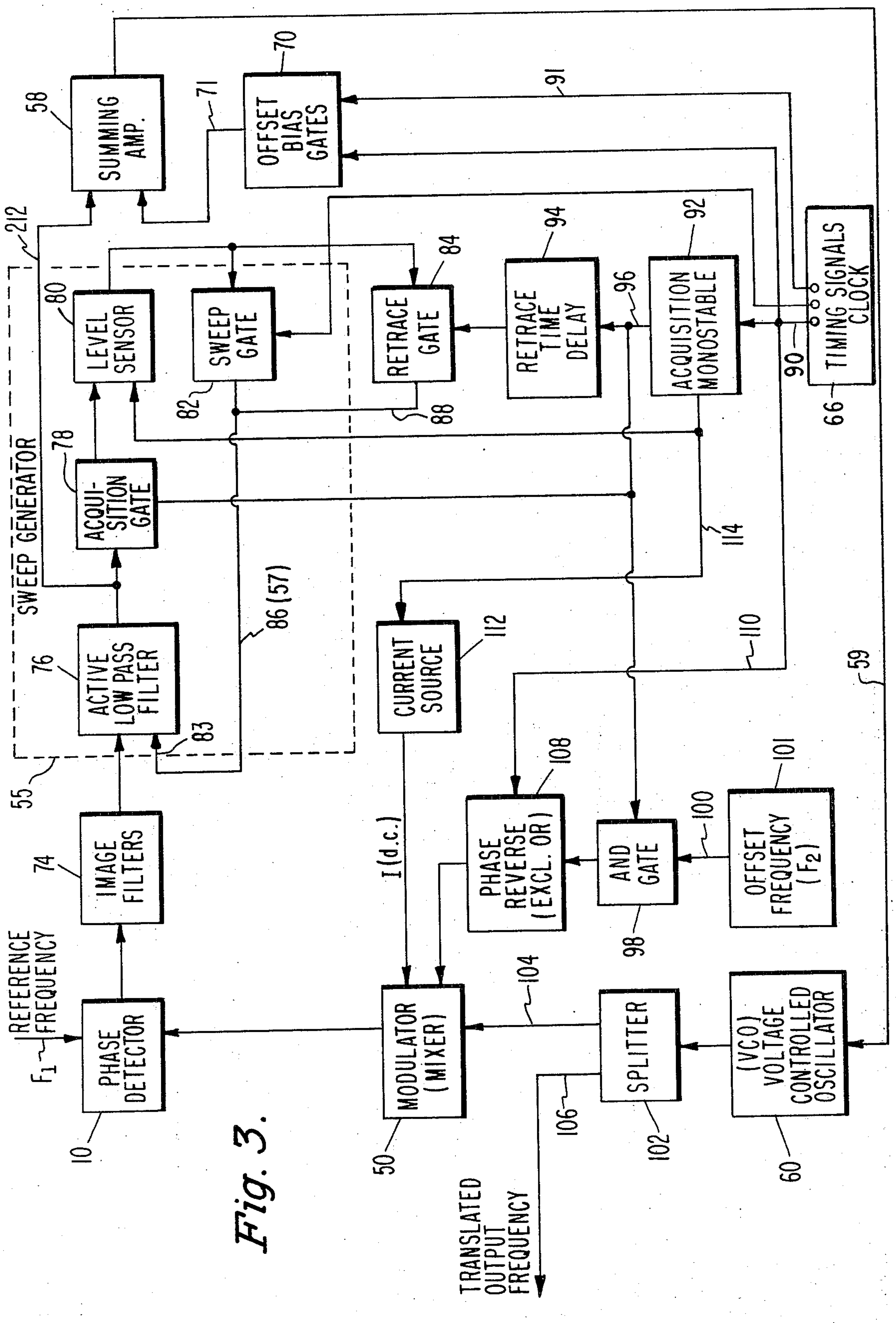
FIG. 3 is a block diagram schematic of a specific form of a system embodying the invention.

Referring now to FIG. 3 there is shown a circuit in block schematic form, illustrating a particular translation loop embodying the invention in which a splitter and image filters are used for still further isolation of the translated side band frequencies from the reference frequencies. The phase detector 10 comparing the output of modulated 50 with a reference frequency F1 passes its output through one or more passive image filters 74 which rejects twice the offset frequencies over and above that of the low pas fillter 76 to keep ripple from being applied to the VCO to modulate it and thereby bring in unwanted spurious frequencies. The number of image filters 74 required will correspond to the number of different frequencies chosen for the offset frequencies $F_2$. As known, second order (two integrators) closed loop response is attenuated 6db per octane. Some portion of the image frequency from the phase detector would therefore pass through the low pass filter 76 as ripple upon the DC control voltage to the VCO. This would in turn modulate the VCO 60 at the image frequency bringing up the undesired spurious signals. The image frequencies are usually far enough above the natural resonant frequency of the loop to enable them to be removed by image filters without appreciably affecting loop stability. The output of the image filters is then applied to active low pass filter 76, which together with the loop gain establishes the natural frequency and bandwidth of the phase lock loop. The active low pass filter 76 is preferably a Miller integrator which serves as a sweep circuit to acquire the carrier during the calibration mode when the offset is disabled. The "calibration mode" is the state of the loop during a periodic interval determined by clock 66 during which a translated output frequency is not required and, thus, the only output (106) is the reference frequency $F_1$. This mode is also the period or mode known as the "acquisition" mode or period during which the VCO of the loop first acquires the reference frequency $F_1$. Any of these modes are effected by disabling the input path of frequency $F_2$ by closing gate 98, and turning on current source 112 over path 114 and activating sweep generator 55. The reference frequency $F_1$ is acquired by the loop in the known manner and reproduced at output path 106. During this mode, any drifts of VCO 60 from its center frequency are stored in filter 76. One output of the active low pass filter is applied to summing amplifier 58 which is controlled by offset bias from gates 70 as described previously for FIG. 2.

Low pass filter 76 together with acquisition gate 78, level sensor 80, and sweep gate 82, form sweep generator 55. Acquisition gate 78 applies the output of filter 76 to level sensor 80 during the acquisition mode or period, i.e., the time period during which the translation loop acquires or locks onto the reference frequency ($F_1$). The remainder of the time period, is the "translation" mode during which the loop is in its normal state operating to generate sum or difference frequencies as desired over output path 106. During the translation mode, sensor 80 is held in such a state that the output voltage of sweep generator 55 over path 212 will sweep in the proper direction to capture the desired side tone upon command of acquisition monostable 92. Sweep gate 82 in response to a timing signal from clock 66 passes the output of level sensor 80 back to the input 83 of filter 76 over path 86 (corresponding in path 57 of FIG. 2) to initiate thereby a sweep voltage over path 212 to summing amplifier 58. The summing amplifier 58 couples the output of the Miller integrator (active low pass filter) 76 to the voltage controlled oscillator 60 over path 59. The summing amplifier 58 steps the frequency of the VCO 60 to each of the desired frequencies (F2) by conventional programmed offset currents such as described above rising clock 66 and gates 70. This causes the translation loop to acquire rapidly the various offset frequencies without skipping cycles while maintaining the voltage memory of the reference frequency by a charge stored in the Miller integrator capacitor derived from the DC error signal from the phase detector 10. The timing signals for controlling the program are provided by a suitable clock source 66 applied at terminal 90 to a conventional acquisition monostable circuit 92 arranged to provide sufficient time to acquire the carrier F1. Monostable 92 is coupled to a retrace time delay circuit 94 over conductor 96. The retrace time delay is a delay circuit to allow the Miller integrator 76 time to fully retrace. The output of monostable 92 is also applied to gate 98 to block the frequency F2 from mixer 50 during the calibration mode and to pass it to the mixer for the translation mode. Exclusive OR gate 108 is used to reverse the phase of the offset frequency from input 100 from a source 101 of each of the desired offset signal frequencies when switching side bands (F2) to engage the level sensor 80 with the Miller integrator 76 at the proper time. The phase reversal, as known in the art, is to assure phase coherence when the offset frequency is being switched from one side band to the other. For this embodiment, a 100 kHz offset frequency (F2) about the reference (F1) is programmed by clock timing control path 91 selecting the proper bias of gates 70. When offsetting reference frequency $F_1$ to the opposite side tone, that is, when operating the loop to provide a difference signal ($F_1 - F_2$) rather than a sum frequency ($F_1 + F_2$), clock 66 provides a signal over path 90 to select the offset bias gate 70 corresponding to the offset frequency $F_2$ and simultaneously provides the gate control for the phase reversal gate 108 to reverse the phase of offset frequency $F_2$ from source 101 through AND gate 98 in its conducting state under control of monostable 92. Thus, the modulator 50 receives a frequency $F_2$ of phase relative to the reference frequency $F_1$ to provide either sum or difference side band frequencies depending on this gated phase reverse control circuit. The offset frequency F2 is a range tone of the type useful in range-rate navigation receivers or a side band frequency useful in data communication systems for frequency synthesizers. The other input of the amplifier 58 is received from the offset bias gates 70 via conductor 71. Summing amplifier 58 as previously indicated adds the active low pass filter output (76) to the offset bias (70) and developes a VCO control voltage over path 59 to the VCO 60. The output of the VCO oscillator according to this feature of the invention, rather being applied back directly to the modulator 50, is applied to a splitter 102 which is comprised of a hybrid junction, one output of which is applied to the mixer 50 over conductor 104 and the other output of which is used as the single translated output frequency F1 ± F2 over conductor 106 as previously described.

The mixer 50, typically a double side band suppressed carrier modulator of known design such as a diode ring modulator, is gated by a phase reversal exclusive OR circuit 108 of conventional design gated by gate circuit 98 under control of synchronized logic circuits 92 and timed from source 90 over conductor 110 as described above. A current source 112 for the modulator 50 is triggered by the monostable 92 over conductor 114 for acquisition mode so that the modulator functions as a gate to pass the output of the splitter without offset frequency.

The circuit of FIG. 3 operates in a manner similar to FIG. 2. Briefly, the monostable 92 applies base bias to the current source 112, typically a common emitter stage, turning it on at a constant level. The constant collector current, determined by the voltage across the emitter resistor of a typical common emitter current source, is applied to the diode ring modulator 50 to turn it on hard as a current-controlled switch, rather than a switching type mixer or modulator. Ordinarily the AC input bi-phase modulates the carrier in the manner of an "exclusive-OR gate," the AC input being the offset frequency $F_2$ from source 101, rather than the DC current I from source 112.

As indicated above, the circuit illustrated in FIG. 3 utilizes a splitter 102, a modulator 50, and a phase detector 52 all in series to give maximum isolation between the reference frequency and the translated output frequency so that the reference does not appear at the output. In addition, the image filters and the active low pass filter keep the unwanted side band frequency from appearing at the output. The net result is nearly a spectrally pure output frequency.

It shoulld be understood that the acquisition of the reference F1 during the reset acquisition or calibration mode is achieved by an automatic sweep circuit that is activated while the offset F2 is disconnected. The offset frequency F2 is derived from another multiple frequency signal source, not shown, which provides in programmed sequence a plurality of frequencies, according to the invention, that can vary from 100 Hz to 10 MHz in any desired series of steps. The translation loop after mixing frequencies F1 and F2 generates an output frequency which is substantially a pure single side band frequency F1 ± F2. The output of the translation loop thys may be the sum or the difference of frequencies F1 and F2. Whether the sum or difference frequency is generated is determined by the bias voltages of the offset bias gates 70 applied to summing amplifier 58.

Figure 4:
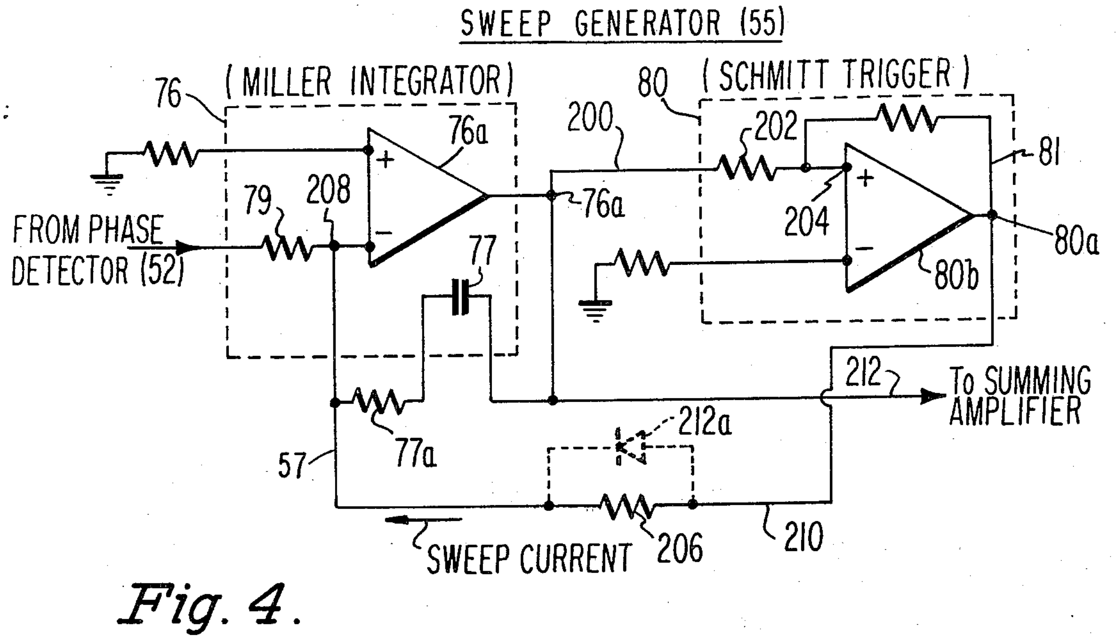
FIG. 4 is a block diagram of a preferred sweep circuit useful in the translation loop of the invention.
Figure 4A:
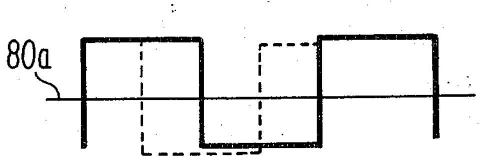
FIGS. 4*a* and 4*b* are wave forms generated in the circuit of FIG. 4.
Figure 4B:
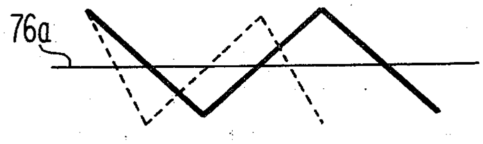

Referring now to FIG. 4 there is shown a preferred form of the sweep generator as indicated by block 55 in FIG. 2. The sweep circuit of FIG. 4 utilizes two operational amplifiers 76*a* and 80*b* with a positive feedback loop 81 to give hysteresis. The amplifier 80*b* is thereby arranged to act as a Schmitt trigger (80) to sense the level of the output voltage of the active low pass filter 54 comprising the operational amplifier 76*a*, the integrating capacitor 77 and input resistor 79. The low pass filter 76 is known in the art as a Miller integrator. The bipolar or square wave output (FIG. 4*a*) of the Schmitt-like trigger 80 drives the Miller integrator 76 causing its output (FIG 4*b*) to sweep in triangular form in a direction determined by the polarity of the bipolar output at the terminal 80*a*. The square wave output at point 80*a* is shown in FIG. 4*a* and the sweep voltage generated at terminal 76*a* is shown in FIG. 4*b*.

Thus, the output (FIG. 4*b*) of the Miller integrator drives the Schmitt trigger via conductor path 200 including resistor 202 to the input terminal 204, causing the Schmitt trigger to reset when a predetermined voltage level is reached. The sweep circuit 55 illustrated in FIG. 4 is essentially an astable triangle wave generator consisting of cross-connected operational amplifier equivalent of a Miller integrator (76) and a Schmitt trigger (80). The sweep duration is jointly controlled by the resistor 206 in the output of the Schmitt trigger applied to the summing junction 208 and the feedback integrating capacitor 77 of the Miller integrator. The rate of the sweep is made sufficiently slow to allow a DC error voltage from the phase detector 52 (FIG. 2) or 10 of (FIG. 3), resulting from the carrier F1 mixing with offset frequency F2 to counteract the sweep current in the Schmitt trigger path 210 at the time the translation loop achieves acquistion of the carrier frequency F1.

The sweep voltage output may be changed from a triangular form to a sawtooth form by utilizing a diode 212*a* shown in dotted-line across resistor 206. With such an arrangement the output wave of the Schmitt trigger represented by dotted lines in FIG. 4*a*, is a rectangular wave as distinguished from the square wave shown in solid lines. The output of the Miller integrator will be a sawtooth as indicated by the dotted lines in FIG. 4*b*. The polarity changes in the square and rectangular waves of FIG. 4*a* determine the peaks of the triangular and sawtooth waves of FIG. 4*b*.

The sweep circuit 55 (FIG. 4) produces an output DC voltage on path 212 which is applied to one input of the summing amplifier 58 of FIG. 2 or FIG. 3. Thus, the VCO is swept in frequency to acquire the reference or carrier in the acquisition mode. The Miller integrator portion of the sweep circuit stores the voltage necessary to control the VCO 60 (FIG. 2) to generate the carrier reference frequency (F1) so that the offset bias currents programmed into the summing amplifier cause the oscillator to step-over to less than the pull-out range of the desired output frequency.

In practice, the time constant of the low pass active filter 76 (FIG. 4) is established by the appropriate selection of an input resistor 79 and a feedback capacitor 77. The damping time is determined by feedback capacitor 77 and feedback resistor 77*a*. The low pass active filter 76 (Miller integrator) provides the memory in the translation loop to store the voltage vs. center frequency of the VCO at that particular temperature. The memory is maintained as long as the loop stays in lock. The slope of the VCO transfer function is an order of magnitude more stable than its absolute value. Therefore differentials between points on this curve are stored in potentiometer positions in the offset bias gates.

A conventional VCO used in a translation loop of this invention can have its frequency altered by 10 percent of the center frequency, noting that a translation loop using a voltage controlled crystal oscillator is usually limited to frequency deviations of 0.01 percent of its center frequency.

What is claimed is:

1. A translation loop having a reference frequency source and an offset frequency source of signals comprising:

a. mixing means having one input coupled to the offset frequency source of signals, a second input and an output, b. a phase detector having one input coupled to the output of the mixer, a second input coupled to the reference source of signals, and an output means for generating a signal for controlling a voltage controlled oscillator, c. a voltage controlled oscillator (VCO) having an input for receiving said phase detector control signal and an output, d. means coupling the output of said voltage controlled oscillator to the second input of said mixer, e. means for periodically inhibiting the offset frequency source of signals to said mixer, whereby the output voltage of said voltage controlled oscillator is periodically calibrated to within one cycle of accuracy of said reference frequency source.

2. A translation loop according to claim 1 including a sweep voltage generator coupled between said phase detector and said voltage controlled oscillator for generating a ramp voltage in response to the output control voltage of said phase detector for controlling said voltage controlled oscillator to acquire and phase lock to a signal frequency determined by said phase detector.

3. A translation loop according to claim 2 including means for varying the voltage level of said sweep voltage generator to generate a ramp voltage to change the voltage controlled oscillator frequency as a sum or difference of the reference and offset frequencies.

4. A translation loop according to claim 3 wherein said voltage level varying means includes bias gates synchronized with said periodic inhibiting means for said offset frequency source.

5. A translation loop according to claim 4 including a summing amplifier coupled between said sweep voltage generator and said voltage controlled oscillator.

6. A translation loop according to claim 5 wherein said sweep voltage generator means includes a Schmitt trigger coupled to the output of a Miller integrator, a feedback path coupled from the output of the Schmitt trigger to the input of the Miller integrator, said Miller integrator including an integrating capacitor and an input resistor coupled to said phase detector.

7. A translation loop according to claim 6 including a passive image filter coupled between said phase detector and said sweep voltage generating means, for rejecting image frequency signals at twice the desired offset frequency.

8. A method of generating, in a closed loop including a mixer, a phase detector, and a voltage controlled oscillator (VCO), whose frequency is controlled by a control signal from said phase detector, a substantially single frequency signal from any one of a wide range of possible frequencies, said single frequency signal being in phase-lock relation to a reference frequency singal within one cycle of accuracy comprising the steps of:

a. locking the frequency of said VCO to the frequency of said reference frequency, b. subsequentially mixing an offset frequency with the frequency of said VCO, c. comparing the mixed frequency with said reference frequency to provide a control signal for controlling the frequency of said VCO, d. subsequentially changing the frequency of said VCO in response to said control signal to a frequency corresponding to the sum or difference of said reference frequency and said offset frequency, and e. periodically inhibiting the mixing of said offset frequency with the VCO frequency and returning said VCO to the frequency of said reference frequency.

* * * * *

UNITED STATES PATENT OFFICE

CERTIFICATE OF CORRECTION

Patent No. 3,793,594 Dated February 19, 1974

Inventor(s) Fred Bethel Griswold

It is certified that error appears in the above-identified patent and that said Letters Patent are hereby corrected as shown below:

Column 4, line 63 insert "loop" after --locked--;
Column 5, line 27 "modulated" should be --modulator--;
Column 5, line 30 "fillter" should be --filter--;

Column 6, line 25 insert "offset" before --frequencies--;
Column 6, line 27 "rising" should be --using--;
Column 7, line 51 "shoulld" should be --should--;
Column 7, line 63 "thys" should be --thus--;
Column 10, line 27 "singal" should be --signal--.

Signed and sealed this 17th day of September 1974.

(SEAL)
Attest:

McCOY M. GIBSON JR.
Attesting Officer

C. MARSHALL DANN
Commissioner of Patents